(12) United States Patent
Yaegashi

(10) Patent No.: US 8,551,691 B2
(45) Date of Patent: Oct. 8, 2013

(54) METHOD OF FORMING MASK PATTERN

(75) Inventor: Hidetami Yaegashi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 53 days.

(21) Appl. No.: 13/355,724

(22) Filed: Jan. 23, 2012

(65) Prior Publication Data

US 2012/0202301 A1    Aug. 9, 2012

(30) Foreign Application Priority Data

Feb. 8, 2011   (JP) .................................. 2011-025465

(51) Int. Cl.
*G03F 7/26*   (2006.01)

(52) U.S. Cl.
USPC .......................................... 430/314; 430/316

(58) Field of Classification Search
USPC .......................................... 430/311, 314, 316
See application file for complete search history.

(56) References Cited

U.S. PATENT DOCUMENTS

| 2005/0123858 A1 | 6/2005 | Ito et al. | |
| 2009/0170330 A1* | 7/2009 | Jung | 438/703 |

FOREIGN PATENT DOCUMENTS

JP    2005-129761    5/2005

* cited by examiner

*Primary Examiner* — Kathleen Duda
(74) *Attorney, Agent, or Firm* — IPUSA, PLLC

(57) ABSTRACT

A disclosed method of forming a mask pattern includes forming a first resist film on a film to be etched, opening portions on the first resist film at a predetermined pitch, a first film on the first resist film so as to cover sidewalls of the first opening portions, a second resist film, second opening portions alternately arranged with the first opening portions on the second resist film, and a second film on the second resist film so as to cover sidewalls of the second opening portions, and removing a part of the second film so that the second film is left as first sidewall portions, a part of the first resist film using the first sidewall portions as a mask to form third opening portions, and a part of the first film while leaving the first film as second sidewall portions to form fourth opening portions.

10 Claims, 9 Drawing Sheets

METHOD OF FORMING MASK PATTERN

CROSS-REFERENCE TO RELATED APPLICATIONS

This patent application is based upon and claims the benefit of priority of Japanese Patent Application No. 2011-025465 filed on Feb. 8, 2011, the entire contents of which are incorporated herein by reference.

BACKGROUND OF THE INVENTION

1. Field of the Invention

The present invention generally relates to a method of forming a mask pattern on a substrate.

2. Description of the Related Art

Along with advances in a highly integrated circuit, wirings and separation widths required for the manufacturing process are being miniaturized. The micropattern is ordinarily formed by making a resist pattern using a photolithographic technique and etching various thin underlying films using the resist pattern as an etching mask. Therefore, in order to form the micropattern, the photolithographic technique is important. However, the micronization of recent semiconductor devices requires resolution better than the resolution limit of the photolithographic technique. Further, the resolution of the ArF immersion exposure technique which is presently a main stream of the micronization is said to reach its resolution limit in 4xnm generation. Therefore, in 3xnm generation achieving further minute micronization, a double patterning technique (Double Patterning: DP) is used. Therefore, a double patterning technique is being actively developed.

Such techniques of forming a pattern of a resolution limit or smaller resolution by the double patterning technique is described in, for example, Patent Document 1.

With Patent Document 1, a first resist opening pattern made of the first resist film is formed and a first hole pattern is formed in an underlying layer using the first resist opening pattern. Subsequently, a second resist opening pattern made of a second resist film is formed, and the second hole pattern is formed in the underlying layer using the formed second resist opening pattern. Such process is called a Lithography Etching Lithography Etching (LELE) process.

However, when the resist pattern is formed by double patterning such as the LELE process described above, the following problems may occur.

With the LELE process, after forming the first resist opening pattern by a coating and developing device, a first hole pattern is etched by an etching device to thereby form the first hole pattern. Thereafter, after the second resist opening pattern is formed by the coating and developing device, the subject undergoes etching again by the etching device to thereby form the second hole pattern. Therefore, there is a drawback that the number of processes increases.

In order to reduce the number of processes, a Lithography Lithography Etching (LLE) process may be used. With the LLE process, after the first resist pattern is formed, the second resist pattern is formed between the first resist patterns, and an underlying thin film is etched using the first resist pattern and the second resist pattern as the etching mask to thereby form a micropattern.

However, in the LLE process, when the first resist pattern including the first resist film is formed and then the second resist film is formed to make the second resist pattern, the first resist pattern may dissolve. Therefore, before forming the second resist film, a barrier layer may be formed on the first resist pattern or an insolubilization process may be performed.

Further, if a resist pattern having a line portion is formed, it is possible to reduce the width of the line portion by a slimming process using, for example, acid. However, when the resist pattern including the opening portions is formed, it is difficult to reduce the sizes of the opening portions by a slimming process or the like. Thus, it is difficult to form opening portions having sizes of the resolution of the photolithography machine or smaller.

[Patent Document 1] Japanese Laid-open Patent Publication No. 2005-129761

SUMMARY OF THE INVENTION

Accordingly, embodiments of the present invention may provide a novel and useful method of forming a mask pattern solving one or more of the problems discussed above.

More specifically, the embodiments of the present invention may provide a method of forming a mask pattern including forming a first resist film on a film to be etched formed on a substrate; forming opening portions on the first resist film at a predetermined pitch; forming a first film on the first resist film so as to cover sidewalls of the first opening portions; forming a second resist film on the first film; forming second opening portions which are alternately arranged with the first opening portions on the second resist film; forming a second film on the second resist film so as to cover sidewalls of the second opening portions; removing a part of the second film so that the second film is left as first sidewall portions covering the sidewalls of the second opening portions; removing a part of the first resist film using the first sidewall portions as a mask to form third opening portions corresponding to the second opening portions on the first resist film; and removing a part of the first film while leaving the first film to cover the sidewalls of the first opening portions as second sidewall portions so as to form fourth opening portions in which the sidewalls of the first opening portions are covered by the second sidewall portions.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 1A through FIG. 7C of embodiments of the present invention.

Hereinafter, reference symbols typically designate as follows:
10: substrate;
11: first film to be etched;
12: second film to be etched;
13: third film to be etched;
14: first resist film;
14a: first opening portion;
14d: third opening portion;
14g: fourth opening portion;
15: first film;
15a,17a: sidewall portion;
16: second resist film;
16a: second opening portion; and
17: second film.

A description is given below, with reference to the FIG. 1 through FIG. 7 of embodiments of the present invention.

Referring to FIG. 1 to FIG. 5, a method of forming a mask pattern of an embodiment is described.

FIG. 1A to FIG. 4 are cross-sectional views schematically illustrating the structure of the substrate for explaining a method of forming a mask pattern of an embodiment. FIG. 5 is a plan view schematically illustrating the structure of the substrate in the process illustrated in FIG. 4 for explaining a method of forming a mask pattern of another embodiment.

Figure 1A:
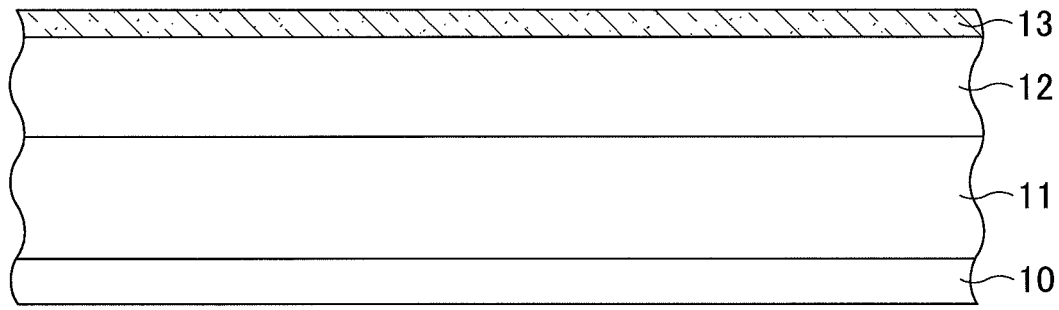
FIG. 1A to FIG. 1C are first cross-sectional views schematically illustrating a structure of a substrate for explaining a method of forming a mask pattern of an embodiment.

With the process illustrated in FIG. 1A, a substrate on which a first film to be etched 11, a second film to be etched 12 and a third film to be etched 13 are sequentially formed in this order is prepared.

The first film to be etched 11 and the second film to be etched 12 are formed with patterns and then function as masks for performing various processes. The patterns are formed on the third film to be etched 13 and then function as masks for forming the patterns of the first film to be etched 11 and the second film to be etched 12. The third film to be etched 13 may have a function as an anti-reflecting coating such as a Bottom Anti-Reflecting Coating (BARC) used for carrying out photolithography of the first resist film 14 formed on the third film to be etched 13.

The material of the first film to be etched 11 is not specifically limited and may be, for example, tetraethoxysilane (TEOS). The thickness of the first film to be etched 11 is not specifically limited and may be, for example, 50 to 500 nm.

The material of the second film to be etched 12 is not specifically limited and may be, for example, amorphous carbon formed by a chemical vapor deposition (CVD) method, polyphenol formed by a spin-on method and an organic material containing a photo resist such as an i-electron beam resist. The thickness of the second film to be etched 12 is not specifically limited and may be, for example, 150 to 300 nm.

The material of the third film to be etched 13 is not specifically limited and may be a composite layer including a spin-on glass (SOG) film, a SiON film or a Low Temperature Oxide (LTO) film and a BARC, namely a SiARC being a BARC containing Si. The thickness of the third film to be etched 13 is not specifically limited and may be, for example, 40 to 120 nm.

Figure 1B:
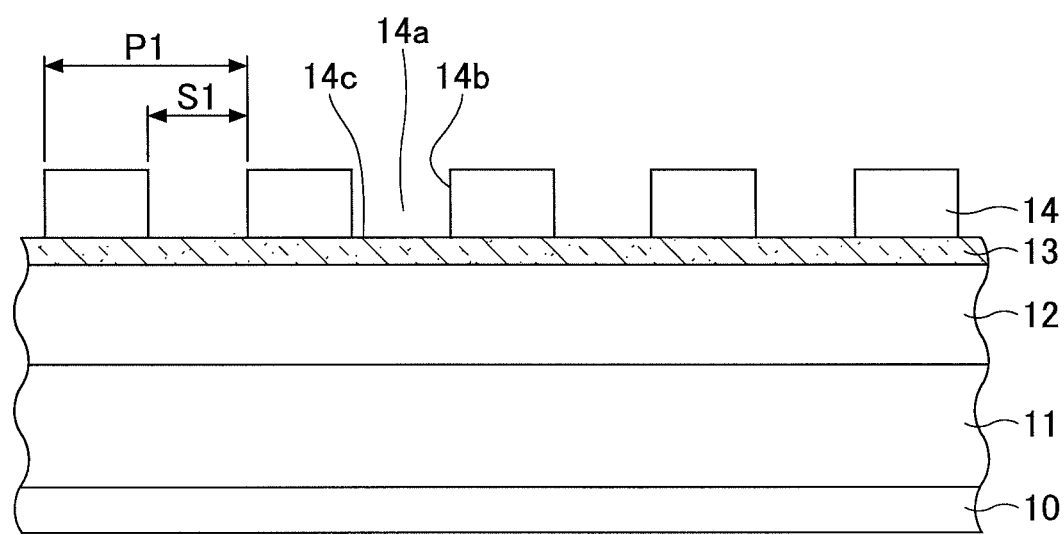

Referring to FIG. 1B, a first resist film 14 is formed on the third film to be etched 13 on the substrate, and first opening portions 14a arranged with a predetermined pitch are formed on the first resist film 14 (a first forming process).

The first resist film 14 is formed on the third film to be etched 13 by a spin-on method using a coating and developing device in which a photolithography machine is installed. An ArF resist may be used as the material of the first resist film 14. The thickness of the first resist film 14 is not specifically limited and may be, for example, 50 to 200 nm.

Thereafter, first opening portions 14a arranged at a first pitch are formed on the first resist film by, for example, a photolithographic technique using the coating and developing device in which the photolithography machine is installed. With this, the first opening portions 14a having opening sizes S1 and arranged at the first pitch 21 are formed. A part of the third film to be etched 13 is exposed inside of the first opening portions 14a.

Subsequently, in the process illustrated in FIG. 1C, a first film 15 is formed on the first resist film 14 so as to cover the sidewalls 14b of the first opening portions 14a (a first film forming process).

The first film 15 is provided to protect the first resist film 14 so as to prevent the first resist film 14 from melting by a solvent for the second resist film 16 in forming the second resist film 16. The first film 15 is provided to reduce the opening sizes of the first opening portions 14a by coating the sidewalls 14b of the first opening portions 14a.

Optical constants of the first film 15 are preferably the same as optical constants of the first resist film 14. The optical constants are a refractive index "n" which is the real part of a complex refractive index and an attenuation coefficient "k" which is the imaginary part of the complex refractive index. By making the optical constants of the first film 15 the same as the optical constants of the first resist film 14, the first film 15 and the first resist film integrally show identical optical properties. Therefore, it is possible to prevent light used for exposing the second resist film 16 in order to form the second opening portions 16a from reflecting on an interface between the first film 15 and the first resist film 14 to thereby reduce a resolution.

The first film 15 may contain at least one of silicon oxide ($SiO_2$), aluminum oxide ($Al_2O_3$), silicon-incorporated aluminum oxide (AlSiO), titanium oxide ($TiO_x$), silicon nitride (SiN), amorphous carbon and polysilicon. Hereinafter, a method of forming the first film 15 (hereinafter, referred to as a "$SiO_2$ film 15") made of $SiO_2$ with molecular layer deposition (hereinafter, referred to as a MLD) at a low temperature, namely a low temperature MLD is described.

In the low temperature MLD, a process in which a raw gas containing silicon is supplied to a processing container of a film forming device and a substrate absorbs a raw material containing silicon and a process in which a gas containing oxygen is supplied into the processing container and the raw material containing silicon is oxidized, are alternately repeated.

Specifically, in the process in which the substrate absorbs the raw material containing silicon, the raw material containing the silicon is aminosilane gas containing two amino groups in one molecule such as a bis(tertiary-butylamino)silane, hereinafter referred to as "BTBAS". This material is supplied into the processing container for a predetermined time period T1. Thus, BTBAS is absorbed on the substrate. The time period T1 is, for example, 1 to 60 sec. The flow rate of the raw material gas containing the silicon is 10 to 500 mL/min (sccm). The pressure inside the processing container may be 13.3 to 665 Pa.

Next, the gas containing oxygen is supplied into the processing container. In the process of oxidizing the silicon material, plasma $O_2$2 gas obtained by, for example, a plasma generating mechanism having a high frequency source is supplied into the processing container for a predetermined time period T2. With this, the BTBAS absorbed on the substrate is oxidized and the $SiO_2$ film 15 is formed. The time period T2 is, for example, 5 to 300 sec. The flow rate of the gas containing oxygen is 100 to 20000 mL/min (sccm). The frequency of high-frequency power source may be 13.56 MHz, and the power of the high-frequency power source is 5 to 1000 W. The pressure inside the processing container may be 13.3 to 665 Pa.

Further, when the process of making the raw material gas containing silicon is absorbed on the substrate and the process of oxidizing the silicon material is switched over, a process of supplying a purge gas made of an inert gas such as a $N_2$ gas while evacuating the processing container into a vacuum may be carried out for a predetermined time period T3 between the above processes. The time period T3 is, for example, 1 to 60 sec. Further, the flow rate of the purge gas is 50 to 5000 mL/min (sccm). It is sufficient to remove the remaining gas inside the processing container. Therefore, it is possible to continuously evacuate under a state in which supplies of all gases are stopped and the supply of the purge gas is also stopped.

The BTBAS is an aminosilane gas in which two amino groups are included inside one molecule used as the raw material gas containing silicon. The aminosilane gas may be bis(diethylamino)silane(BDEAS), bis(dimethylamino)silane (BDMAS), di-isopropylaminosilane(DIPAS), bis(ethylmethylamino)silane (BEMAS) instead of the BTBAS. A raw material gas of a silicone source gas containing three amino groups or more in one molecule may be used, or an aminosilane gas containing one amino group in one molecule may be used.

The gas containing oxygen may be an $O_2$ gas, a NO gas, a $N_2O$ gas, a $H_2O$ gas, or an $O_3$ gas. These gases are changed to plasma using a high frequency electric field so as to be used as an oxidant. By using gas plasma containing oxygen as described, the $SiO_2$ film may be formed at a low temperature of 300° C. or less. Further, by adjusting the gas flow rate of a gas containing oxygen, the power of the high-frequency power source and the pressure inside the processing container, the $SiO_2$ film may be formed at a temperature of 100° C. or less or at a room temperature.

Figure 1C:
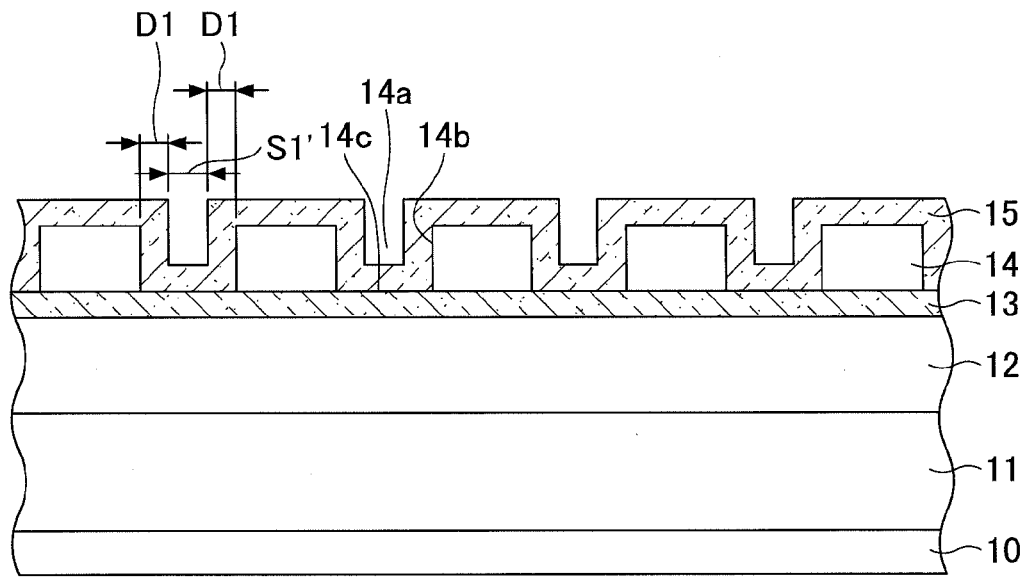

By performing the film forming method as described above, a first film 15 is formed on the entire surface of the substrate 10 including the insides of the first opening portions 14a as illustrated in FIG. 1C. Said differently, the first film 15 is formed to cover the sidewalls of the first opening portions 14a. Further, the first film 15 is formed on the third film to be etched 13 exposed inside of the first opening portions 14a at positions of the bottom surfaces of the first opening portions 14a. Provided that the film thickness of the first film 15 is D1, the width of the first film 15 covering the sidewalls 14b of the first opening portions 14a becomes D1. Therefore, the opening sizes S1' of the first opening portions 14a covered by the first film 15 becomes S1'=S1−2×D1. When the first pitch P1 is, for example, 80 nm and an opening size S1 is, for example, 40 nm, and the film thickness D1 is, for example, 10 nm, the opening sizes S1' of the first opening portions 14a of which sidewalls are covered by the first film 15 is 20 nm.

Figure 2A:
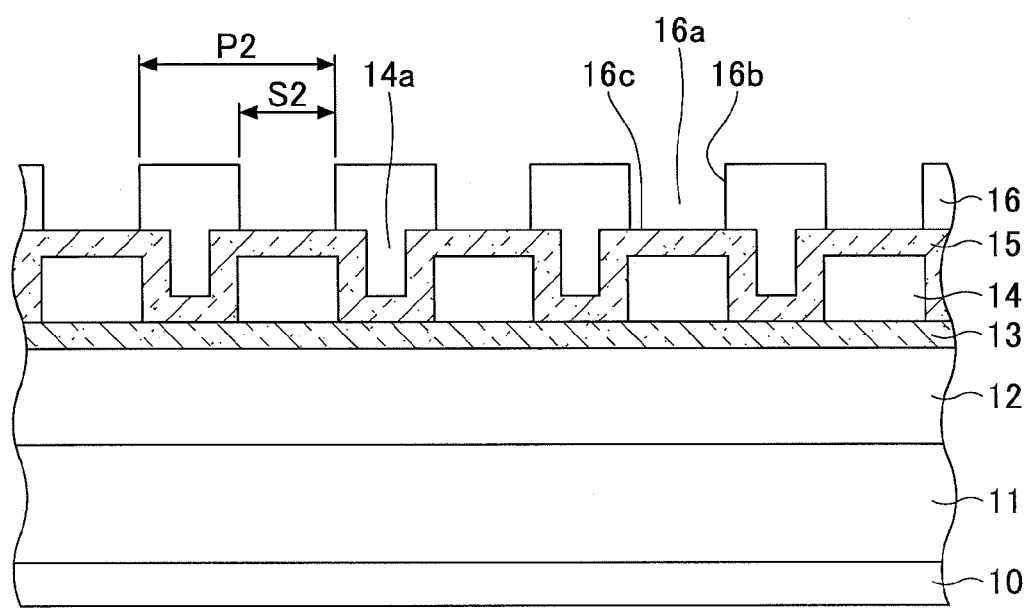
FIG. 2A to FIG. 2C are second cross-sectional views schematically illustrating the structure of the substrate for explaining the method of forming the mask pattern of the embodiment.

Next, in the process illustrated in FIG. 2A, a second resist film 16 is formed on the first film 15, and second opening portions 16a alternately arranged with the first opening portions 14a are formed as a second forming process.

At first, the second resist film 16 is formed on the first film 15 by a spin-on method using, for example, the coating and developing device in which the photolithography machine is installed in a manner similar to the formation of the first resist film. The material of the second resist film 16 is, for example, an ArF resist in a manner similar to the formation of the first resist film. The thickness of the second resist film 16 is not specifically limited and may be, for example, 50 to 200 nm.

Thereafter, the second opening portions 16a arranged at a second pitch P2 are formed on the second resist film 16 by, for example, a photolithographic technique using the coating and developing device in which the photolithography machine is assembled. With this, the second opening portions 16a having opening sizes S2 and arranged at the second pitch P1 are formed. At this time, a part of the first film 15 is exposed inside the second opening portions 16a.

The second pitch P2 is substantially the same as the first pitch P1. The second opening portions 16a are formed so as to be alternately arranged with the first opening portions 14a.

As described, by setting the optical constants of the first film 15 to be substantially the same as optical constants of the first resist film 14 as described above, it is possible to prevent reflection of light irradiating the second resist film 16. Thus, it is possible to prevent the resolution from lowering.

Further, when the first opening portions 14a are formed in the first resist film 14, an alignment mark may be formed and covered by the first film 15. With this, when the second opening portions 16a are formed on the second resist film 16, the alignment (the position) of the second opening portions 16a is determined based on the alignment mark formed on the first resist film 14 in the vicinity of the second resist film 16. Thus, accuracy when aligning (positioning) the second opening portions 16a is improved.

Subsequently, in the process illustrated in FIG. 2B, a second film 17 is formed on the second resist film 16 so as to cover the sidewalls 16b of the second opening portions 16a (a second film forming process).

The second film 17 is provided to reduce the opening sizes of the first opening portions 14a by coating the sidewalls 14b of the first opening portions 14a.

The second film 17 may contain at least one of silicon oxide ($SiO_2$), aluminum oxide ($Al_2O_3$), silicon-incorporated aluminum oxide (AlSiO), titanium oxide ($TiO_x$), silicon nitride (SiN), amorphous carbon or polysilicon in a manner similar to the first film 15.

As an example, when the second film 17 made of $SiO_2$ is formed, the low temperature MLD may be used in a manner similar to the first film 15.

Figure 2B:
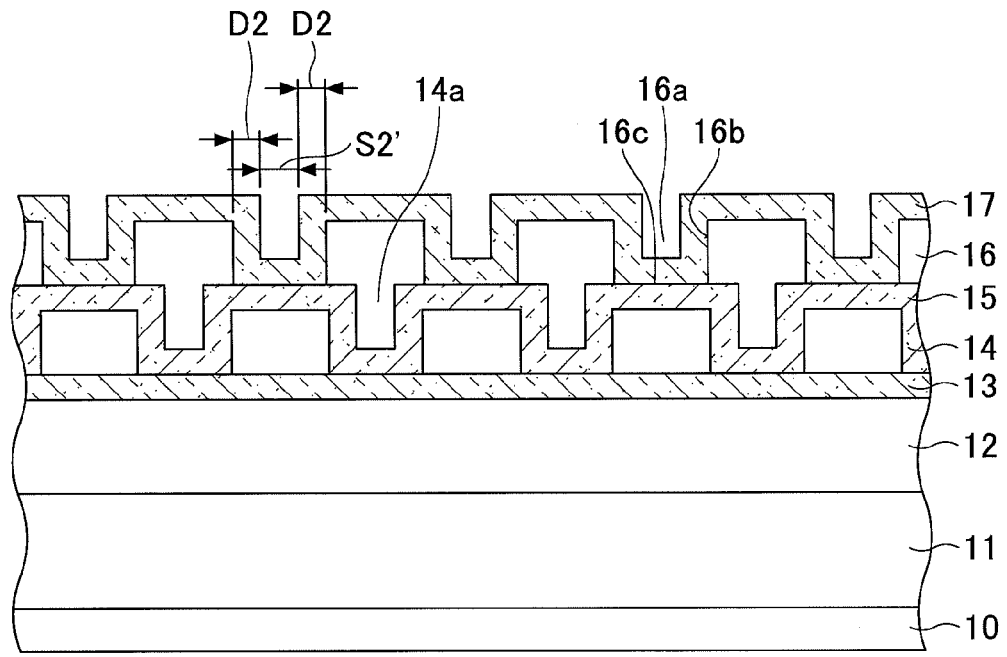

As a result, the second film 17 is formed on the entire surface of the substrate 10 including the insides of the second opening portions 16a as illustrated in FIG. 2B. Said differently, the second film 17 is formed to cover the sidewalls 16b of the second opening portions 16a. Further, the second film 17 is formed on the first film 15 exposed inside the second opening portions 16a at positions of bottom surfaces 16c of the second opening portions 16a. Provided that the film thickness of the second film 17 is D2, the width of the second film 17 covering the sidewalls 16b of the second opening portions 16a becomes D2. Therefore, the opening sizes S2' of the second opening portions 16a covered by the second film 17 becomes S2'=S2−2×D2. When the second pitch P2 is, for example, 80 nm and an opening size S2 is, for example, 40 nm, and the film thickness D2 is, for example, 10 nm, the opening sizes S2' of the second opening portions 16a of which sidewalls are covered by the second film 17 is 20 nm.

Subsequently, in the process illustrated in FIG. 2C, a part of the second film 17 is removed so that the second film 17 is left as the sidewall portions 17a covering the sidewalls 16b of the second opening portions 16a (a first removing process).

Figure 2C:
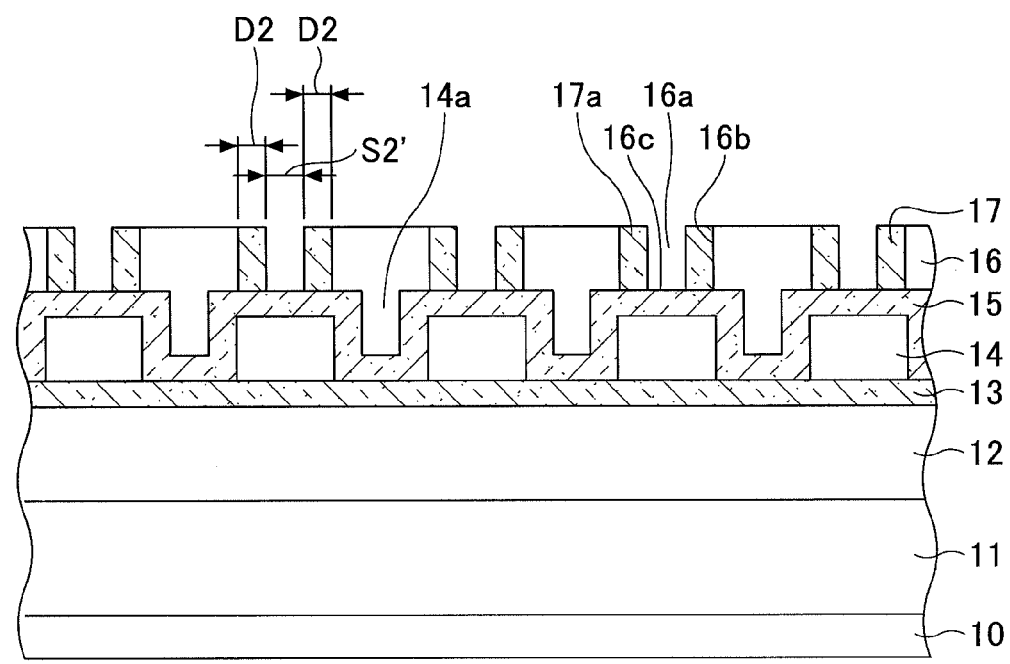

Referring to FIG. 2C, the second film 17 formed on the upper surface of the second resist film 16 and the bottom surfaces 16c of the second opening portions 16a is anisotropically etched while the second film 17 is left as the sidewall portions 17a covering the sidewalls 16b of the second opening portions 16a. An etchant gas etching the second film 17 is not specifically limited. When the second film 17 is made of $SiO_2$, a gas of CF system such as $CF_4$, $C_4F_8$, $CHF_3$, $CH_3F$, $CH_2F_2$ and a mixed gas thereof further containing an Ar gas or the like, the mixed gas further containing an additive such as oxygen may be used. When the second film 17 is made of aluminum oxide ($Al_2O_3$), silicon-incorporated aluminum oxide (AlSiO), titanium oxide (TiO, or $TiO_2$), silicon nitride (SiN), amorphous carbon or polysilicon, halide gases such as $Cl_2$, $Cl_2$+HBr, $Cl_2$+$O_2$, $CF_4$+$O_2$, $SF_6$, $CL_2$+$N_2$ $CL_2$HCl, HBr+$Cl_2$+$SF_6$ may be used.

The first removing process may be performed using, for example, the plasma etching device including the processing container, a gas supplying portion for supplying a processing gas into the processing container and a retaining portion for retaining a substrate inside the processing container. Inside the processing container, an upper electrode for applying high-frequency power is provided over the retaining portion, whereas the retaining portion is simultaneously a lower electrode to which the high-frequency power is applicable. While the substrate 10 is retained by the retaining portion, for example, the $CF_4$ gas, the $O_2$ gas and the Ar gas are supplied into the processing container to maintain the inside of the processing container to have a pressure of 6.7 Pa (50 mTorr) or less. Thereafter, high-frequency power of 1000 W of which frequency is 60 MHz is supplied to the upper electrode to thereby change the processing gas to plasma, and high-frequency power of 300 W of which frequency is 13.56 MHz is supplied to the lower electrode. With this, the second film 17 is etched.

As a result, a pattern which has the second opening portions 16a and the sidewalls 16b covered by the sidewall portions 17a is formed. As described above, when the second pitch P2 is, for example, 80 nm and an opening size S2 is, for example, 40 nm, and the film thickness D2 is, for example, 10 nm, the opening sizes S2' of the second opening portions 16a in which sidewalls 16b are covered by the second film 17a may be 20 nm.

Subsequently, by removing a part of the first resist film 14 using the sidewall portions 17a as a mask, third opening portions 14d corresponding to the second opening portions 16a are formed on the first resist film 14. Simultaneously, a part of the first film 15 is removed so that the sidewall portions 15a covering the sidewalls 14b of the first opening portions 14a are left. Thus, fourth opening portions 14g are formed by coating the sidewalls 14b of the first opening portions 14a with the sidewall portions 15a (a second removing process).

The second removing process can be performed by various methods. As an example, referring to FIG. 3A to FIG. 3C, the first etching process, the second etching process and the third etching process are described.

Figure 3A:
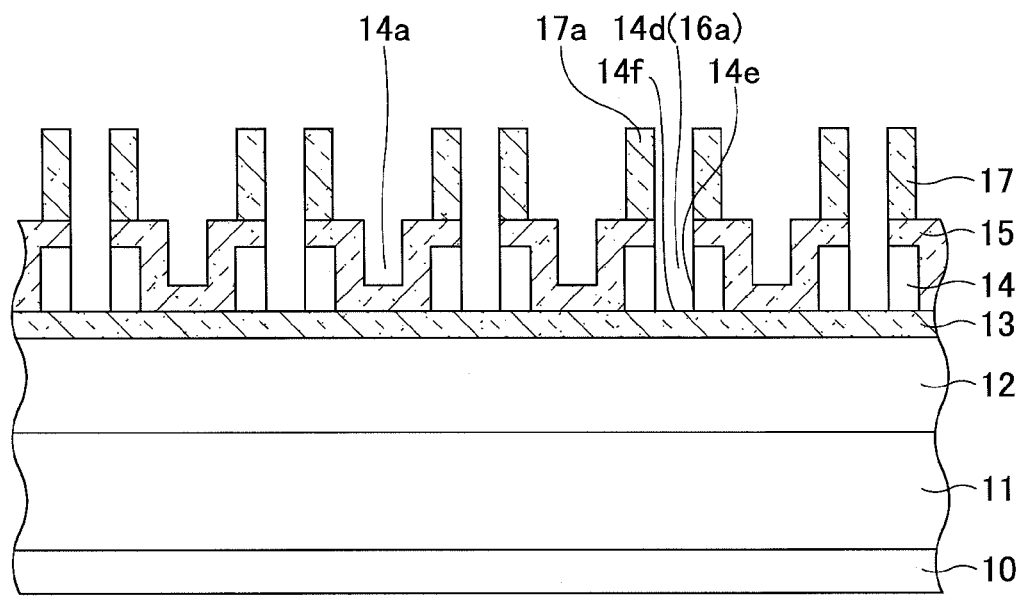
FIG. 3A to FIG. 3C are third cross-sectional views schematically illustrating the structure of the substrate for explaining the method of forming the mask pattern of the embodiment.

In the process illustrated in FIG. 3A, the first film 15 and the first resist film 14 are removed by etching inside the second opening portions 16a using the sidewall portions 17a as the mask. At the same time, the remaining second resist film 16 is removed (a first etching process).

An etchant gas etching the first film 15 is not specifically limited. In a manner similar to the etching of the second film 17, when the first film 15 is made of $SiO_2$, a mixed gas of a gas of a CF system and an Ar gas or the like may be used as an etchant gas. In a manner similar to the etching of the second film 17, when the first film 15 is made of aluminum oxide ($Al_2O_3$), silicon-incorporated aluminum oxide (AlSiO), titanium oxide ($TiO_x$ or $TiO_2$), silicon nitride (SiN), amorphous carbon or polysilicon, for example, a halide gas may be used as the etchant gas.

However, the etching rate of the second film 17 with the etchant gas is preferably smaller than the etching rate of the first film 15 with the etchant gas. At this time, a selection ratio which is a ratio of the etching rate of the first film 15 relative to the etching rate of the second film 17 becomes great increases, thereby scarcely etching the sidewall portions 17a used as the mask. Therefore, when the first film 15 is etched, the shape is accurately processed.

While the substrate 10 is retained by the retaining portion of the plasma etching device after the first removing process, for example, the $CF_4$ gas, the $O_2$ gas and the Ar gas are supplied into the processing container to maintain the inside of the processing container to have a pressure of 6.7 Pa (50 mTorr) or less. Thereafter, high-frequency power of 1000 W of which frequency is 60 MHz is supplied to the upper electrode to thereby change the processing gas to plasma, and high-frequency power of 300 W of which frequency is 13.56 MHz is supplied to the lower electrode. With this, the first film 15 is etched.

Referring to FIG. 3A, when the first film 15 is removed by etching the first film 15 inside the second opening portions 16a using the sidewall portions 17a as the mask, a part of the first resist film 14 is etched. As a result, the third opening portions 14d corresponding to the second opening portions 16a are formed on the first resist film 14. The third film to be etched 13 is exposed on the bottom surfaces 14f of the third opening portions 14d.

While the part of the first resist film 14 is etched, the second resist film 16 is removed by etching.

Subsequently, in the process illustrated in FIG. 3B, a part of the first film 15 is removed using the sidewall portions 17a as the mask so as to leave the first film 15 as the sidewall portions 15a after the second resist film 16 is removed by etching (a second etching process).

In a manner similar to the first etching process, when the first film 15 is made of $SiO_2$, the second etching process can be performed using a mixed gas of a gas of a CF system and an Ar gas. When the first film 15 is made of aluminum oxide ($Al_2O_3$), silicon-incorporated aluminum oxide (AlSiO), titanium oxide ($TiO_x$ or $TiO_2$), silicon nitride (SiN), amorphous carbon or polysilicon, for example, a halide gas may be used as an etchant gas.

However, the etching rate of the second film 17 with the etchant gas is preferably smaller than the etching rate of the first film 15 with the etchant gas. At this time, a selection ratio which is a ratio of the etching rate of the first film 15 relative to the etching rate of the second film 17 increases, thereby to scarcely etch the sidewall portions 17a used as the mask. Therefore, when the first film 15 is etched, the shape is accurately processed.

While the substrate 10 is retained by the retaining portion of the plasma etching device after the first removing process, for example, the etchant gas is supplied into the processing container to maintain the inside of the processing container to have a pressure of 6.7 Pa (50 mTorr) or less. Thereafter, high-frequency power of 1000 W of which frequency is 60 MHz is supplied to the upper electrode to thereby change the etchant gas to plasma, and high-frequency power of 300 W of which frequency is 13.56 MHz is supplied to the lower electrode. With this, the first film 15 is etched.

As a result, fourth opening portions 14g are formed by coating the sidewall portions 15a on the sidewalls 14b of the first opening portions 14a. The third film to be etched 13 is exposed on the bottom surfaces 14h of the fourth opening portions 14 g.

Figure 3B:
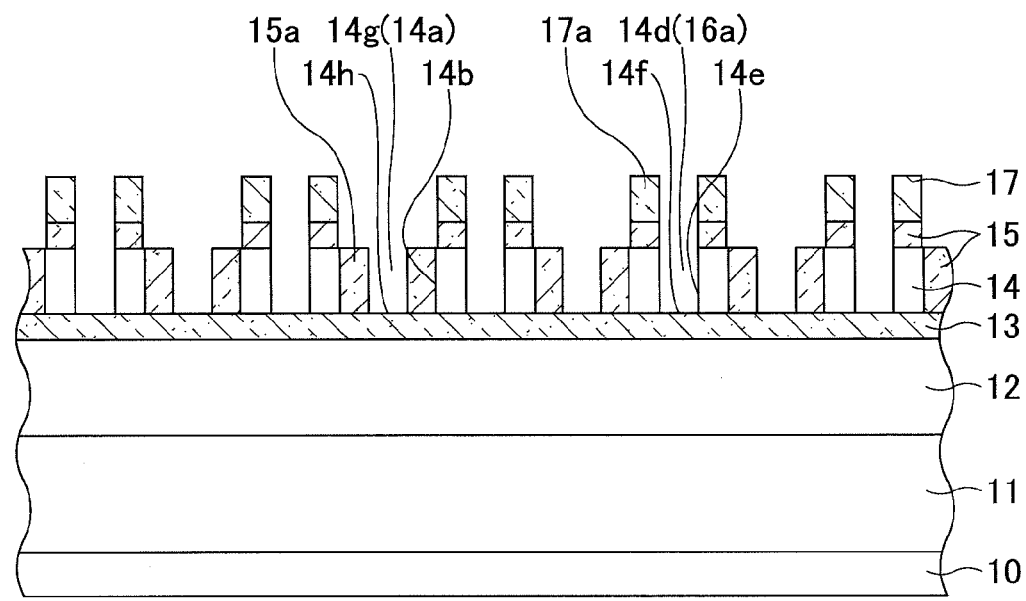

In the process illustrated in FIG. 3B, a reactant may be deposited on the sidewalls 14e of the third opening portions 14d which are formed on the first resist film corresponding to the second opening portions 16a to protect the sidewalls 14e by adjusting processing conditions such as the flow rate of the etchant gas, the pressure and the temperature inside the processing container, and the high-frequency power applied to the upper electrode and the lower electrode.

Subsequently, in the process illustrated in FIG. 3C, the sidewall portions 17a are removed by etching (a third etching process).

In a manner similar to the first etching process and the second etching process, when the sidewall portions 17a are made of $SiO_2$, a mixed gas of a gas of a CF system and an Ar gas or the like may be used as the etchant gas. When the sidewall portion 17a is made of aluminum oxide ($Al_2O_3$), silicon-incorporated aluminum oxide (AlSiO), titanium oxide ($TiO_x$), silicon nitride (SiN), amorphous carbon or polysilicon, for example, a halide gas may be used as the etchant gas.

However, the etching rate of the first film 15 with the etchant gas is preferably smaller than the etching rate of the sidewall portion 17a, i.e., the second film 17 with the etchant gas. At this time, a selection ratio which is a ratio of the etching rate of the second film 17 relative to the etching rate of the sidewall portion 15a becomes great to thereby scarcely etch the sidewall portion 15a in etching the sidewall portion 17a. Therefore, the sidewall portions 15a are accurately shaped in etching the sidewall portions 17a.

While the substrate 10 is retained by the retaining portion of the plasma etching device after the second etching process, for example, an etchant gas is supplied into the processing container to maintain the inside of the processing container to have a pressure of 6.7 Pa (50 mTorr) or less. Thereafter, high-frequency power of 1000 W of which frequency is 60 MHz is supplied to the upper electrode to thereby change the etchant gas to plasma, and high-frequency power of 300 W of which frequency is 13.56 MHz is supplied to the lower electrode. With this, the sidewall portions 17a are etched.

Figure 3C:
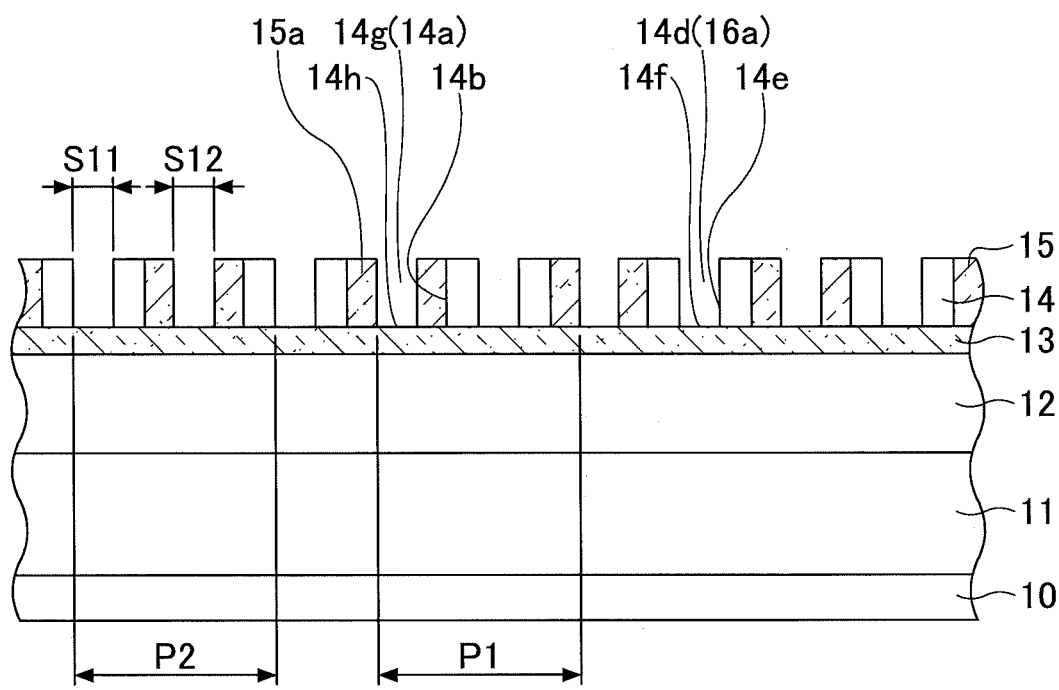

In the process illustrated in FIG. 3C, when the sidewall portion 17a is removed by etching, the first film 15 on a lower side of the sidewall portion 17a is also removed by etching.

As a result, the third opening portions 14d corresponding to the second opening portions 16a are formed on the first resist film 14, and the fourth opening portions 14g are formed by coating the sidewall portions 15a on the sidewalls 14b of the first opening portions 14a. The fourth opening portions 14g are arranged at a first pitch P1, and the third opening portions 14d are formed at a second pitch P2 substantially the same as the first pitch P1. The third opening portions 14d and the fourth opening portions 14g are alternately arranged.

Further, the opening sizes of the third opening portions 14d are set to be S11 and the opening sizes of the fourth opening portions 14g are set to be S12. Then, S11 substantially equals to S2', and S12 substantially equals to S1'. Provided that the pitches P1 and P2 are, for example, 80 nm, the opening sizes S1 and S2 are, for example, 40 nm, and D1 and D2 are, for example, 10 nm, the opening sizes S11 and S12 may be 20 nm.

Figure 4:
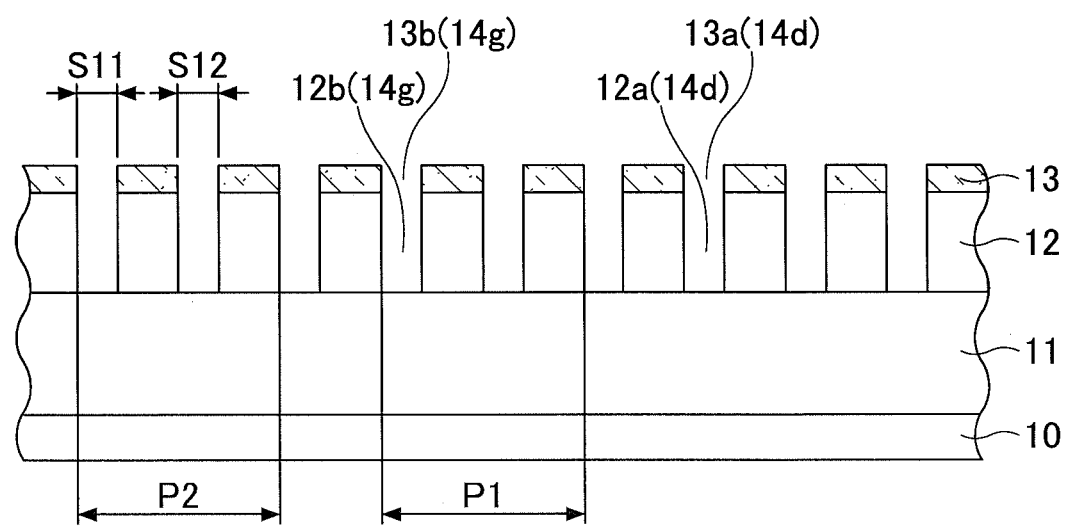
FIG. 4 is a fourth cross-sectional view schematically illustrating the structure of the substrate for explaining the method of forming the mask pattern of the embodiment.
Figure 5:
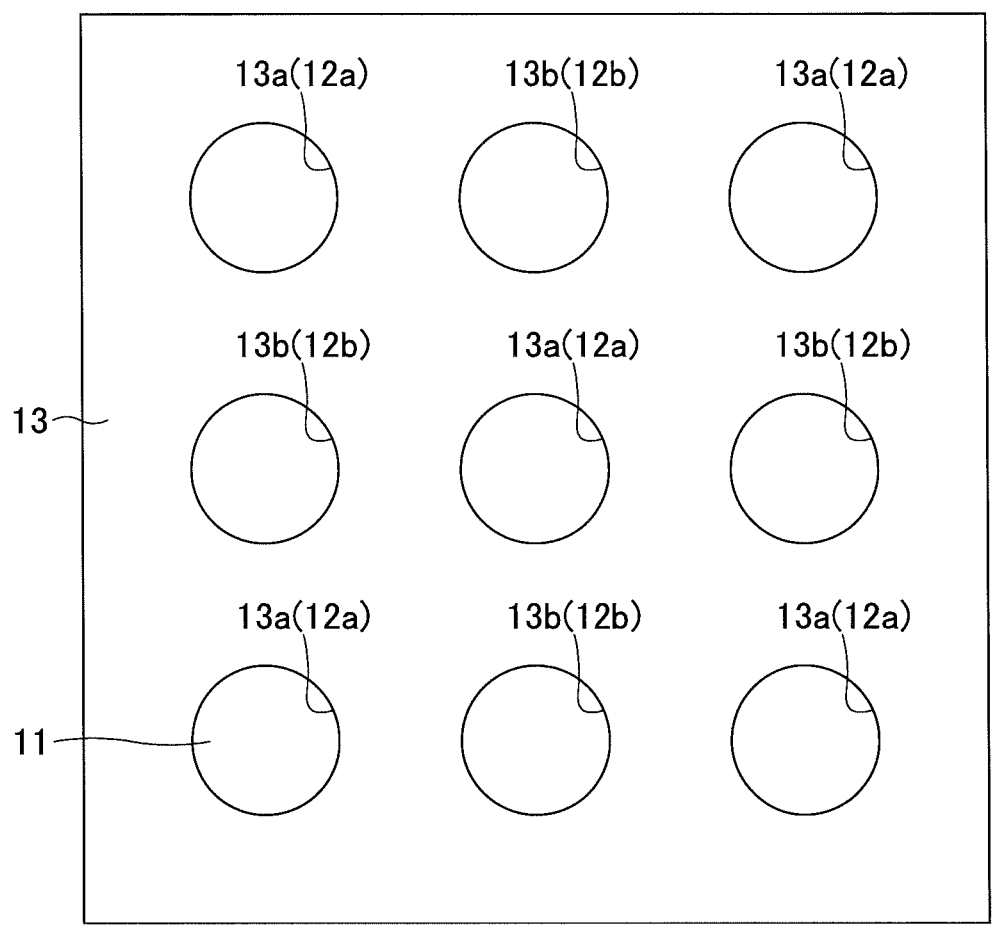
FIG. 5 is a plan view schematically illustrating the structure of the substrate in the process illustrated in FIG. 4 for explaining a method of forming a mask pattern of another embodiment.

In the process illustrated in FIG. 4, a pattern having the third opening portions 14d and the fourth opening portions 14g is used as a mask to etch a part of the third film to be etched 13 and a part of the second film to be etched 12 (an etching process of a film to be etched).

When the third film to be etched 13 is made of, for example, SiARC, a mixed gas of a gas comprising a CF system and an Ar gas or a halide gas may be used. When the second film to be etched 12 is made of, for example, an organic material, a mixed gas of a gas comprising a CF system and an Ar gas or a halide gas may be used.

However, the etching rate of the first resist film with the etchant gas and the etching rate of the first film 15 with the etchant gas are preferably smaller than the etching rate of the third film to be etched 13 with the etchant gas and the etching rate of the second film to be etched 12 with the etchant gas. At this time, a selection ratio which is a ratio of the etching rates of the first resist film 14 and the first film 15 relative to the etching rates of the third film to be etched 13 and the second film to be etched 12 becomes great enough to etch the third film to be etched 13 and the second film to be etched 12 while leaving the mask. Therefore, the third film to be etched 13 and the second film to be etched 12 are accurately shaped.

While the substrate 10 is retained by the retaining portion of the plasma etching device after the third etching process, for example, an etchant gas is supplied into the processing container to maintain the inside of the processing container to have a pressure of 6.7 Pa (50 mTorr) or less. Thereafter, high-frequency power of 1000 W of which frequency is 60 MHz is supplied to the upper electrode to thereby change the etchant gas to plasma, and high-frequency power of 300 W of which frequency is 13.56 MHz is supplied to the lower electrode. With this, the third film to be etched 13 and the second film to be etched 12 are etched.

As a result, opening portions 13a and 13b corresponding to the third opening portions 14d and the fourth opening portions 14g are formed on the third film to be etched 13, and opening portions 12a and 12b corresponding to the third opening portions 14d and the fourth opening portions 14g are formed on the second film to be etched 12. The opening portions 13b and 12b are arranged at the first pitch P1, and the opening portions 13a and 12a are arranged at the second pitch P2 substantially the same as the first pitch P1. Further, the opening portions 13a and 12a and the opening portions 13b and 12b are alternately arranged. Further, the first film to be etched 11 is exposed on the bottom surfaces of the opening portions 13a and 12a and the bottom surfaces of the opening portions 13b and 12b.

Further, the opening sizes of the opening portions 13a and 12a are equal to S11, and the opening sizes of the opening portions 13b and 12b are equal to S12. Provided that the pitches P1 and P2 are, for example, 80 nm, the opening sizes S1 and S2 are, for example, 40 nm, and D1 and D2 are, for example, 10 nm, the opening sizes S11 and S12 may be 20 nm. Therefore, if the resolution of the photolithography machine is 40 nm, it is possible to form a mask pattern having opening portions of an opening size of 20 nm, which is the resolution of the photolithography machine or smaller.

With the embodiment, the film thickness D1 of the first film 15 and the film thickness D2 of the second film 17 are determined by calculating back to equate the opening sizes S11 of the third opening portions 14d with the opening sizes S12 of the fourth opening portions 14g. With this, the opening portions arranged at a pitch substantially half of the first pitch P1 of the first opening portions 14a and a pitch substantially half of the second pitch P2 of the second opening portions 16a may be formed.

As described above, the mask pattern is formed so that the first opening portions 14a and the second opening portions 16a are alternately arranged in a first direction, and the opening portions 13a and 12a and the opening portions 13b and 12b are alternately arranged in the first direction. However, the mask pattern may be configured to alternately arrange the first opening portions 14a and the second opening portions 16a in the first direction and simultaneously in a second direction different from the first direction. As an example, referring to FIG. 5, a mask pattern may be configured such that the opening portions 13a and 12a and the opening portions 13b and 12b are alternately arranged in an X direction and a Y direction.

Next, referring to a comparative example, reduction of the number of processes in the embodiment in comparison with the LELE process is described.

FIG. 6A to FIG. 7C are cross-sectional views schematically illustrating a method of forming a mask pattern of an embodiment, in which structures of the substrate in the various processes are schematically illustrated.

In the comparative example, processes illustrated in FIG. 1A to FIG. 1C are performed in a manner similar to the embodiment. At first, a first film to be etched 11, a second film to be etched 12 and a third film to be etched 13 are sequentially formed on a substrate 10 in this order. Referring to FIG. 1B, a first resist film 14 is formed on the third film to be etched 13 on the substrate 10, and first opening portions 14a arranged with a predetermined pitch are formed on the first resist film 14 (a first forming process). Subsequently, a first film 15 is formed on the first resist film 14 so as to cover the sidewalls 14b of the first opening portions 14a (a first film forming process).

Figure 6A:
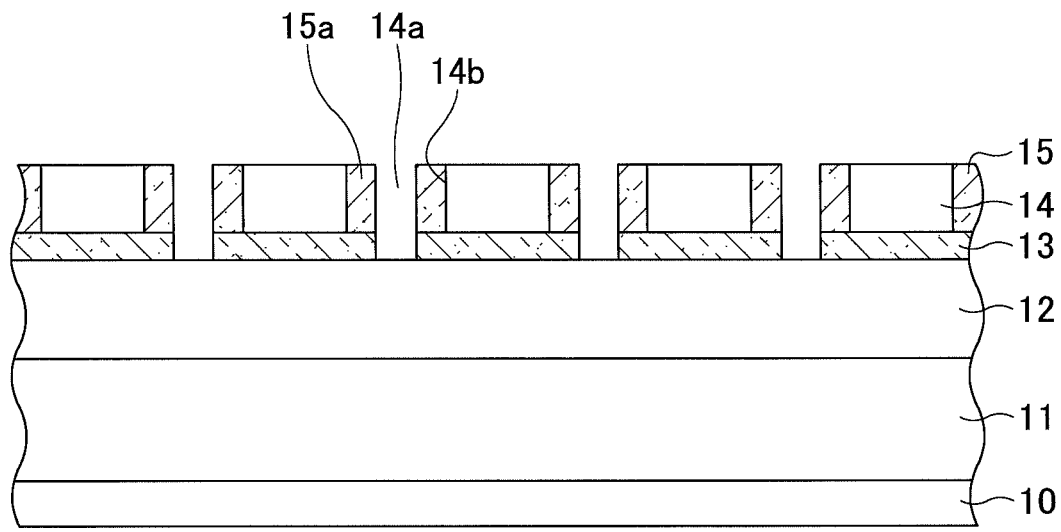
FIG. 6A to FIG. 6C are first cross-sectional views schematically illustrating a structure of a substrate for explaining a method of forming a mask pattern of a comparative example.

Thereafter, a process illustrated in FIG. 6A is performed in the comparative example. Referring to FIG. 6A, the first film 15 formed on the upper surface of the first resist film 14 and the bottom surfaces of the first opening portions 14a are anisotropically etched while the first film 15 is left as the sidewall portions 15a covering the sidewalls 14b of the first opening portions 14a. Further, a part of the third film to be etched 13 is etched using the first opening portions 14a of which sidewalls 14b are covered by the sidewall portions 15a as masks.

Subsequently, the first resist film 14 and the first film 15 are removed by etching in the process illustrated in FIG. 6B. With this, opening portions 13a corresponding to the first opening portions 14a are formed on the third film to be etched 13.

Figure 6B:
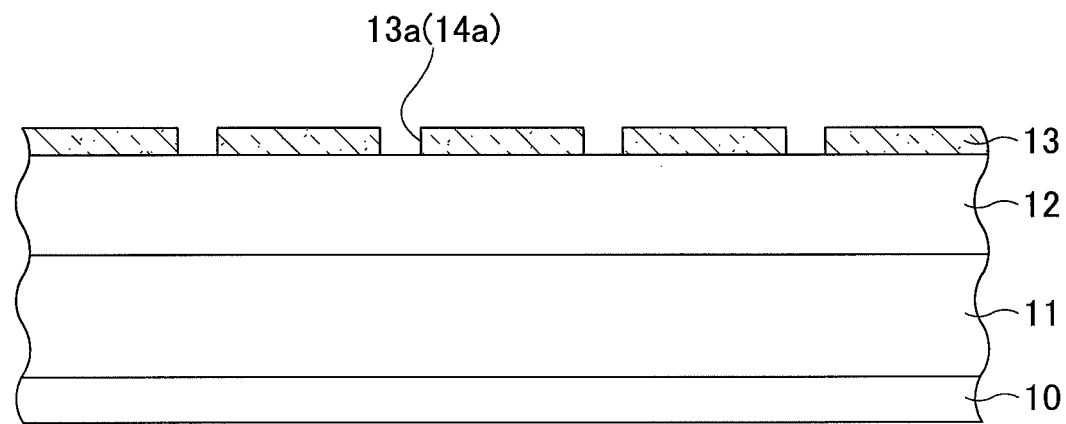
Figure 6C:
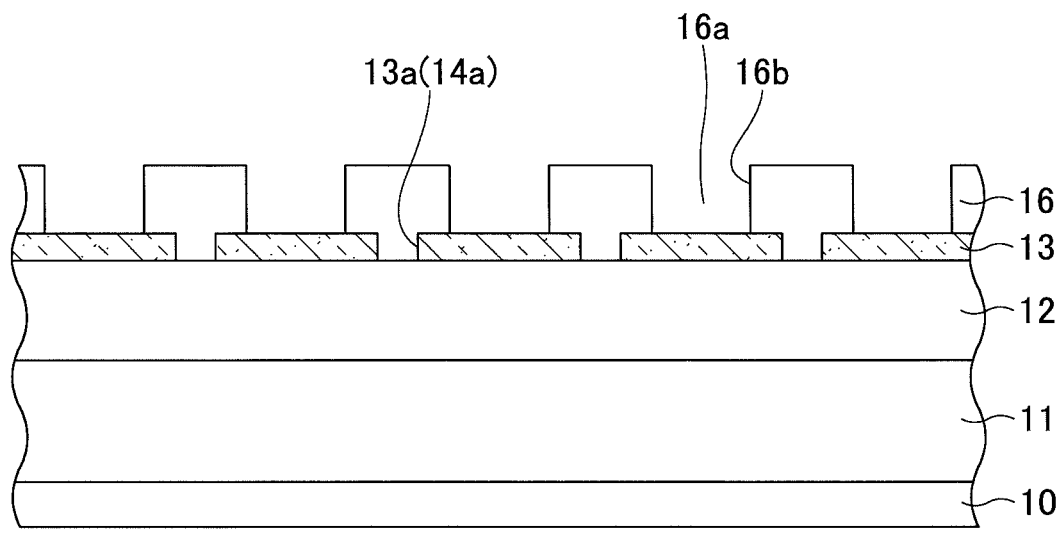

Next, in the process illustrated in FIG. 6C, a second resist film 16 is formed over the substrate, and second opening portions 16a alternately arranged with the first opening portions 14a are formed (a second forming process).

Figure 7A:
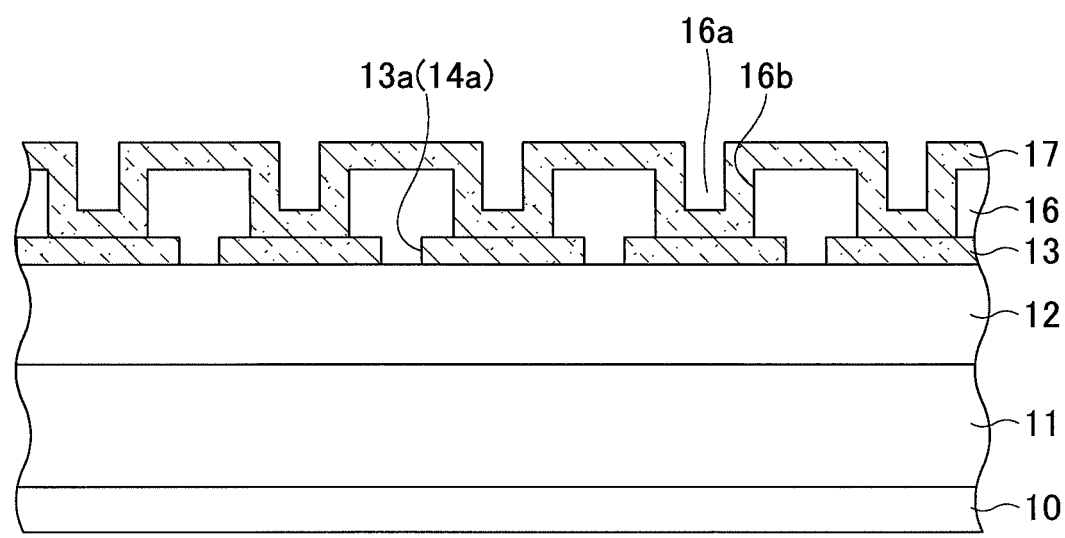
FIG. 7A to FIG. 7C are second cross-sectional views schematically illustrating the structure of the substrate for explaining the method of forming the mask pattern of the comparative example.

Subsequently, in the process illustrated in FIG. 7A, a second film 17 is formed on the second resist film 16 so as to cover the sidewalls 16b of the second opening portions 16a (a second film forming process).

Figure 7B:
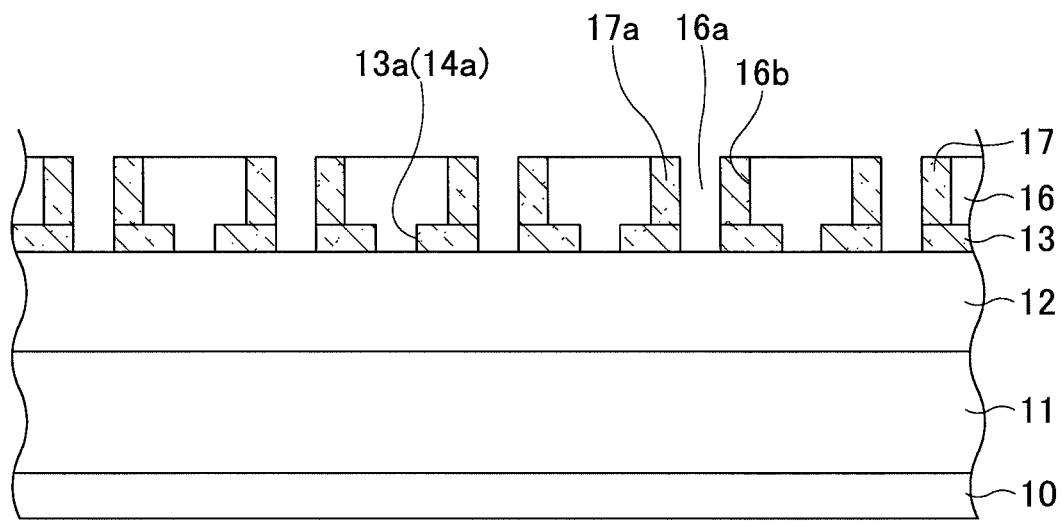

Referring to FIG. 7B, the second film 17 formed on the upper surface of the second resist film 16 and the bottom surfaces of the second opening portions 16a is anisotropically etched while the second film 17 is left as the sidewall portions 17a covering the sidewalls 16b of the second opening portions 16a. Further, a part of the third film to be etched 13 is etched using the second opening portions 16a of which the sidewalls 16b are covered by the sidewall portions 17a as masks (a second removing process).

Figure 7C:
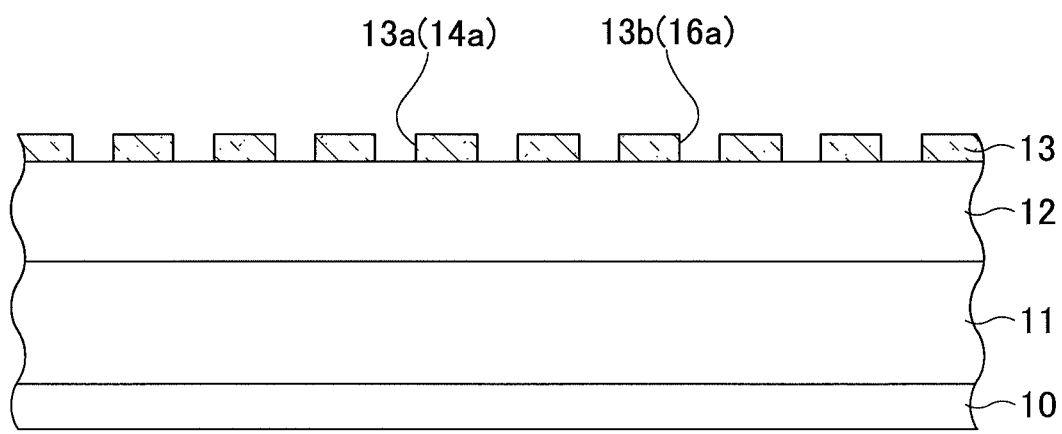

Subsequently, the second film 17 and the second resist film 16 are removed by etching in the process illustrated in FIG. 7C. With this, the opening portions 13b corresponding to the second opening portions 16a are formed on the third film to be etched 13.

Subsequently, the second film to be etched 12 is etched using the third film to be etched 13 on which the opening portions 13a and 13b are formed as a mask to thereby form a mask pattern illustrated in FIG. 4.

With the method of forming a mask pattern of the comparative example, after the processes illustrated in FIG. 6A and FIG. 6B are performed by an etching device, the process illustrated in FIG. 6C is performed by a coating and developing device in which a photolithography machine is assembled. Thereafter, the processes illustrated in FIG. 7B and FIG. 7C are performed by, for example, an etching device. As described, because the processes by the etching devices are performed twice, there is a problem that the number of processes increases.

However, in the method of forming a mask pattern of the embodiment, the processes illustrated in FIG. 2C to FIG. 3C are continuously performed by, for example, the etching device. Therefore, in comparison with the LELE process of the comparative example, the number of processes can be reduced.

In the comparative example, two separate etching processes are performed. Therefore, when the pattern shape formed by the first etching process shifts from a predetermined position, an accuracy of arranging the second opening portions 16a may be lowered to thereby lower the accuracy of the shape of the formed mask pattern.

On the other hand, with the embodiment, only one etching process is performed. Therefore, the accuracy of arranging the second opening portions 16a can be prevented from lowering in forming the second opening portions 16a on the second resist film 16 to thereby prevent the accuracy of the shape of the formed mask pattern from decreasing.

With the embodiment, it is possible to prevent the second resist film 16 formed on the first film 15 from directly contacting the first resist film 14 by forming the first film 15 on the first resist film 14. Further, it is possible to reduce the opening sizes of the first opening portions 14a by covering the sidewalls 14b of the first opening portions 14a which are formed on the first resist film 14 with the first film 15. Therefore, when the second resist film 16 is formed, the first resist film is prevented from being dissolved and simultaneously has minute opening portions having sizes of the resolution of the photolithography machine or smaller.

Further, with the embodiment, when plural substrates are continuously processed, the opening size of the substrate may be measured and processing conditions of the substrates may be changed based on the measured opening sizes. For example, when a mask pattern is formed on a substrate, an opening size S11 of the third opening portions 14d or the opening size of the opening portions 13a and 12a and an opening size S12 of the fourth opening portions 14g or the opening size of the opening portions 13b and 12b are measured. Then, by changing the processing conditions in forming the mask pattern on another substrate based on the measured opening sizes S11 and S12 and the reference values of the opening sizes S11 and S12, the film thickness D1 of the first film 15 and the film thickness D2 of the first film 17 may be changed. With this, the opening sizes S11 and S12 are accurately controlled so as to approach the reference values.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A method of forming a mask pattern comprising:
    forming a first resist film on a film to be etched formed on a substrate;
    forming opening portions on the first resist film at a predetermined pitch;
    forming a first film on the first resist film so as to cover sidewalls of the first opening portions;
    forming a second resist film on the first film;
    forming second opening portions which are alternately arranged with the first opening portions on the second resist film;
    forming a second film on the second resist film so as to cover sidewalls of the second opening portions;
    removing a part of the second film so that the second film is left as first sidewall portions covering the sidewalls of the second opening portions;
    removing a part of the first resist film using the first sidewall portions as a mask to form third opening portions corresponding to the second opening portions on the first resist film; and
    removing a part of the first film while leaving the first film to cover the sidewalls of the first opening portions as second sidewall portions so as to form fourth opening portions in which the sidewalls of the first opening portions are covered by the second sidewall portions.

2. The method of forming the mask pattern according to claim 1,
    wherein the removing of the part of the first resist film and the removing the part of the first film include:
    removing the first film and the first resist film inside the second opening portions using the first sidewall portions as the mask and removing the second resist film;
    removing the part of the first film using the first sidewall portions as the mask while leaving the first film as the second sidewall portions; and
    removing the first sidewall portions by etching.

3. The method of forming the mask pattern according to claim 2, wherein a material of the first film differs from a material of the second film.

4. The method of forming the mask pattern according to claim 3,
    wherein, in the removing the part of the first resist film and the removing the part of the first film, an etching rate of the second film is smaller than an etching rate of the first film.

5. The method of forming the mask pattern according to claim 1,
    wherein an optical constant of the first resist film is substantially equal to an optical constant of the first resist film.

6. The method of forming the mask pattern according to claim 1,
    wherein the first film is made of at least one of silicon oxide, aluminum oxide, silicon-incorporated aluminum oxide, titanium oxide, silicon nitride, amorphous carbon and polysilicon.

7. The method of forming the mask pattern according to claim 1,
    wherein the second film is made of at least one of silicon oxide, aluminum oxide, silicon-incorporated aluminum oxide, titanium oxide, silicon nitride, amorphous carbon and polysilicon.

8. The method of forming the mask pattern according to claim 1,
    wherein a film thickness of the first film and a film thickness of the second film are determined so that first opening sizes of the third opening portions become equal to second opening sizes of the fourth opening portions.

9. The method of forming the mask pattern according to claim 1, further comprising:
    measuring the first opening sizes of the third opening portions and the second opening sizes of the fourth opening portions; and
    changing a film thickness of the first film or a film thickness of the second film based on the measured first opening sizes and the measured second opening sizes.

10. The method of forming the mask pattern according to claim 1, further comprising:
    etching the film to be etched using a pattern including the third opening portions and the fourth opening portions.

* * * * *